(12) United States Patent
Chakravarti et al.

(10) Patent No.: US 6,429,149 B1
(45) Date of Patent: Aug. 6, 2002

(54) LOW TEMPERATURE LPCVD PSG/BPSG PROCESS

(75) Inventors: Ashima B. Chakravarti, Hopewell Junction; Richard A. Conti, Mt. Kisco; Laertis Economikos; Byeongju Park, both of Wappingers Falls, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/511,394

(22) Filed: Feb. 23, 2000

(51) Int. Cl.[7] ............................ H01L 21/31; H01L 21/469
(52) U.S. Cl. ...................... 438/787; 438/783; 438/784; 438/788
(58) Field of Search ............................... 438/783, 784, 438/787, 778

(56) References Cited

U.S. PATENT DOCUMENTS

| | | | |
|---|---|---|---|
| 5,486,589 A | 1/1996 | Inoue | 528/17 |
| 5,874,368 A | 2/1999 | Laxman et al. | 438/794 |
| 5,976,991 A | 11/1999 | Laxman et al. | 438/768 |
| 6,124,607 A | * 9/2000 | Sandhu et al. | 257/309 |
| 6,153,621 A | * 11/2000 | Xia et al. | 427/255.393 |

OTHER PUBLICATIONS

Anonymous, "Combined Oxide and Nitride Spacer Deposition By Using Two Liquid Sources At One Low Temperature In Single Furnace", *Research Disclosure*, Apr. 1998, p. 445.

* cited by examiner

*Primary Examiner*—Trung Dang
*Assistant Examiner*—William M. Brewster
(74) *Attorney, Agent, or Firm*—Jay H. Anderson; Wood, Phillips, Katz, Clark & Mortimer

(57) ABSTRACT

A disclosed process use low pressure chemical vapor deposition (LPCVD) of doped oxide film on a substrate. The process includes the steps of providing a substrate in an LPCVD reactor and flowing BTBAS and oxygen into the LPCVD reactor to react on the substrate to deposit an oxide film on the substrate. A doped precursor is flowed into the LPCVD reactor to dope the oxide film as it is deposited on the substrate. This process produces doped oxide film at a relatively low LPCVD reaction temperature.

18 Claims, 6 Drawing Sheets

LOW TEMPERATURE LPCVD PSG/BPSG PROCESS

FIELD OF THE INVENTION

This invention relates to a process of forming oxide films on a semi-conductor substrate and, more particularly, to a low temperature LPCVD process.

BACKGROUND OF THE INVENTION

Production of semiconductor devices often requires the deposition of thin dielectric films on wafers. One technique that has been used to deposit thin films on semi-conductor substrates is low-pressure chemical vapor deposition (LPCVD). It is desirable to have low temperature processes in semiconductor manufacturing to meet the thermal budget requirements of the devices.

Previously, the conventional source materials for LPCVD oxide films have been $SiH_4$, $Si_2H_6$ and TEOS (tetra ethyl ortho silicate). More recently, it has been demonstrated that using BTBAS (bis-tertiary-butyl-amino silane) as a source material provides a lower temperature LPCVD process for silicon nitride deposition with improved particulate performance and usable film uniformity.

Despite the previous work on nitride with BTBAS source materials, it is not known whether a good quality doped oxide can be deposited using BTBAS as a source such that it can be applied to gap fill applications successfully or at sufficiently low temperature to be compatible with back end processing.

The present invention is directed to further improvements in semiconductor processing.

SUMMARY OF THE INVENTION

In accordance with one aspect of the invention, a method utilizes BTBAS to form doped oxide at relatively low reaction temperatures.

In accordance with another aspect of the invention, a method utilizes BTBAS in gap fill applications.

Broadly, in accordance with one aspect of the invention, there is disclosed the process of low pressure chemical vapor deposition (LPCVD) of doped oxide film on a substrate. The process includes the steps of providing a substrate in an LPCVD reactor and flowing BTBAS and oxygen into the LPCVD reactor to react on the substrate to deposit an oxide film on the substrate. A dopant precursor is flowed into the LPCVD reactor to dope the oxide film as it is deposited on the substrate.

Optionally, a wet or dry anneal using O2 or N2 in the range of 600C–750C after deposition can be done to densify the oxide (USG, PSG, BPSG, other doped oxides) or to reflow and densify the BPSG film for gap fill applications.

It is a feature of the invention that the substrate comprises a semiconductor wafer.

It is another feature of the invention that the temperature of the LPCVD reactor is in a range of 400 C to 650 C, and preferably is in a range of 420 C to 550 C, and more preferably is below 500 C.

It is another feature of the invention that the dopant precursor is selected from a group consisting of $PH_3$, TEPO (triethylphosphate), TMPi (trimethylphosphite), $B_2H_6$, TEB (triethylborate) and TMB (trimethylborate).

There is disclosed in accordance with another aspect of the invention the process of LPCVD of doped oxide film on a substrate comprising the steps of providing a substrate in an LPCVD reactor and flowing BTBAS and oxygen into the LPCVD reactor to react on the substrate to deposit an oxide film on the substrate at a select reaction temperature. Dopant precursor(s) is/are flowed into the LPCVD reactor to dope the oxide film as it is deposited on the substrate.

There is disclosed in accordance with a further aspect of the invention the process of LPCVD of doped oxide film on a substrate comprising the steps of providing a substrate in an LPCVD reactor and flowing BTBAS and oxygen into the LPCVD reactor to react on the substrate to deposit an oxide film on the substrate at a select reaction rate. Phosphorous precursor is flowed into the LPCVD reactor to dope the oxide film as it is deposited on the substrate at a relatively low reaction temperature.

There is disclosed in accordance with yet another aspect of the invention the process of LPCVD of oxide film for gap fill, a semiconductor substrate defining plural gaps to be filled by the undoped oxide film. The process comprises the steps of providing the semiconductor substrate in an LPCVD reactor and flowing BTBAS and oxygen into the LPCVD reactor to react on the substrate to deposit a relatively conformal oxide film on the substrate.

Optionally, a wet or dry anneal using O2 or N2 in the range of 600C–750C after deposition can be done to densify the doped oxide (USG, PSG, BPSG, other oxides) or to reflow and densify the BPSG film for gap fill applications.

It is a feature of the invention that the temperature of the LPCVD reactor is in a range of 500 C to 650 C in the case of undoped BTBAS oxide deposition for gap fill applications.

It is another feature of the invention to flow a dopant precursor into the LPCVD reactor to dope the oxide film as it is deposited on the semiconductor substrate to produce a doped glass film. The doped glass film is selected from a group consisting of As, B, P, Ge and/or F doped glass films.

It is a feature of the invention that the temperature of the LPCVD reactor is in a range of 400C to 650C.

Further features and advantages of the invention will be readily apparent from the specification and from the drawings.

DETAILED DESCRIPTION OF THE INVENTION

Figure 1:
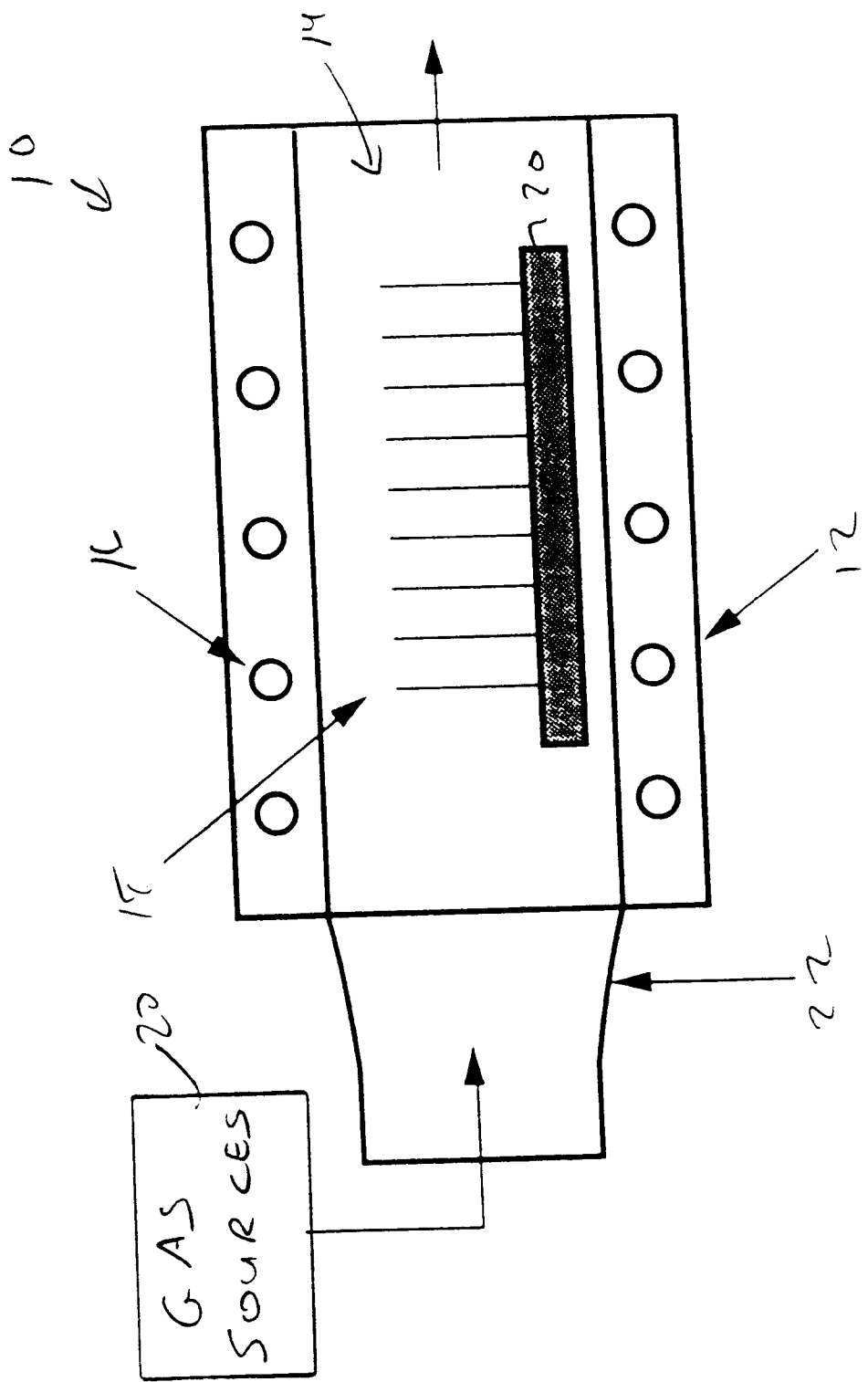
FIG. 1 is a generalized illustration of an LPCVD reactor used in the process according to the invention.

Referring initially to FIG. 1, a generalized diagram illustrates a low pressure chemical vapor deposition (LPCVD) reactor 10 for implementing the processes according to the invention for deposition of doped and undoped oxide films on substrates.

The reactor 10 includes a furnace body 12 to define an interior chamber 14. Heating elements 16 surround the chamber 14 to control reaction temperature. A plurality of wafers 18 are carried on a carrier 20 in the chamber 14.

As is conventional in an LPCVD process, a precursor reactant is introduced into the chamber 14. Particularly, the precursor comprises gas flow from one or more gas sources 20 that flow into the chamber 14 through a quartz tube 22. The gases interact on the wafers 18 in the presence of the particular temperature to produce a film on the wafers 18.

In accordance with the invention, the reactor 10 implements a method of fabricating an oxide film, such as USG (undoped silicate glass) PSG (phospho-silicate glass), BSG (boro-silicate glass) or BPSG (boro-phospho-silicate glass) films. The gas sources include BTBAS and oxygen if undoped silicon dioxide film is deposited. At the same time, other suitable precursors for the dopants are flowed into the chamber 14 to dope the silicon dioxide film as the film is deposited, to provide in situ doping. The precursors for phosphorus could be organic or inorganic in nature, such as, for example, $PH_3$, TEPO and TMPi. The precursors for boron could likewise be organic or of inorganic nature and may be, for example, $B_2H_6$, TEB and TMB. The selection of the particular dopant source is determined by the required deposition rate and temperature consistent with both the deposition process and the thermal budget of the device.

Figure 2:
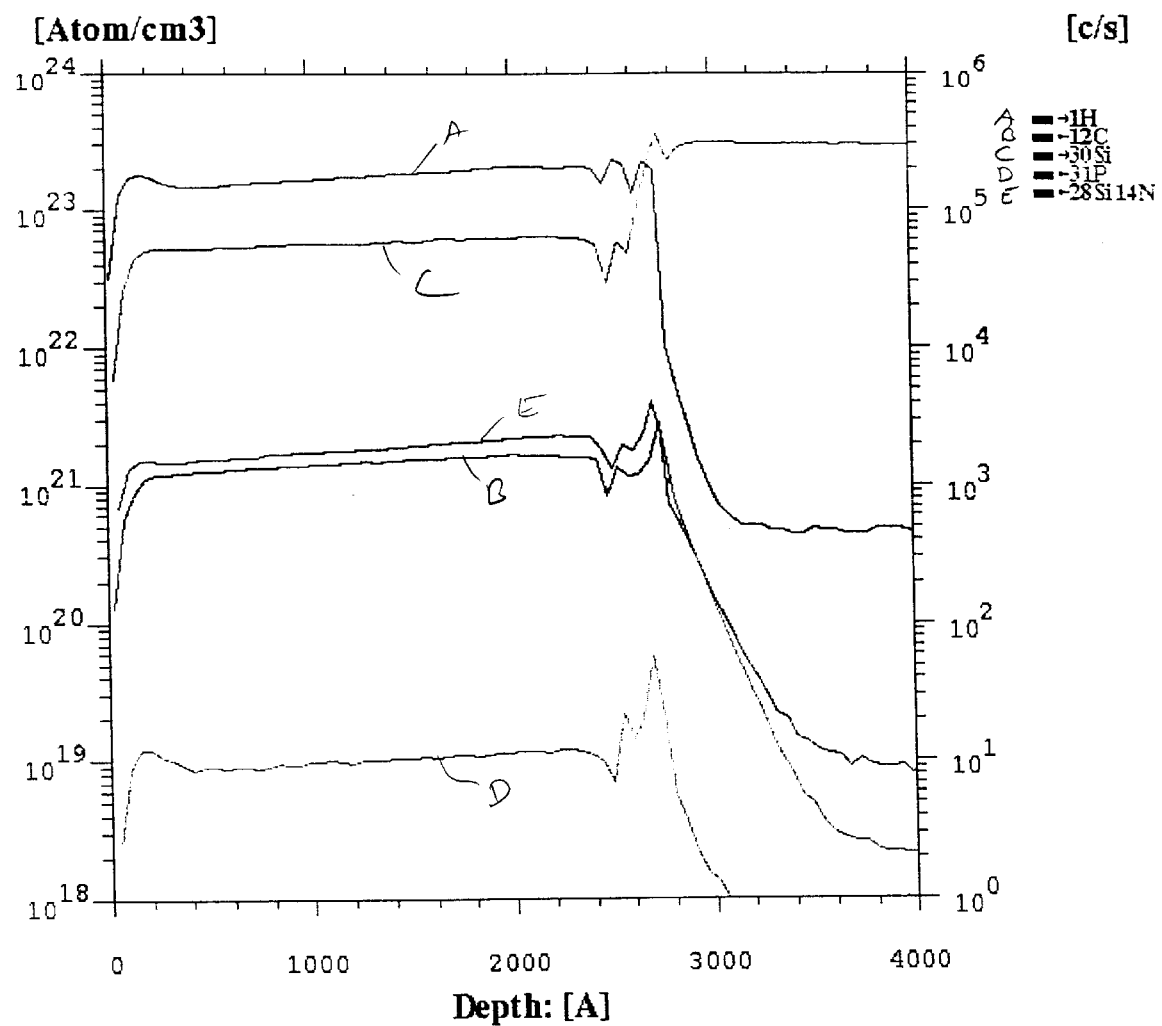
FIGS. 2–5 are SIMS curves illustrating test results from semiconductor devices manufactured using both prior processes and the process according to the invention.

In the case of phosphorus doped BTBAS films, the deposition rate is enhanced compared to otherwise similar processing conditions. (Comparison of the tables 1 and 2) As is obvious to anyone skilled in this art, the enhancement of the deposition rate due to the phosphorus doping can be traded for a lower deposition rate with similar deposition rate. Comparison of table 1 and 2 show that the deposition temperature is reduced by 75C–100C by the phosphorus doping. The following tables, along with FIGS. 2–5, provide comparative data supporting enhancement in deposition rate and reduction in reaction temperature using phosphorous doping with BTBAS source material. Particularly, Table 1 illustrates test results for plural test runs using BTBAS source material for USG deposition. Corresponding FIG. 2 is a Secondary Ion Mass Spectrometry (SIMS) curve for the test run labeled EBM5 in Table 1.

The SIMs data indicates that the C and N compositions are about 1 and 1.3% atomic. That is, in spite of the 2:1 atomic ratio of N:Si in the BTBAS precursor, we deposit an oxide with low N and C incorporation.

Figure 5:
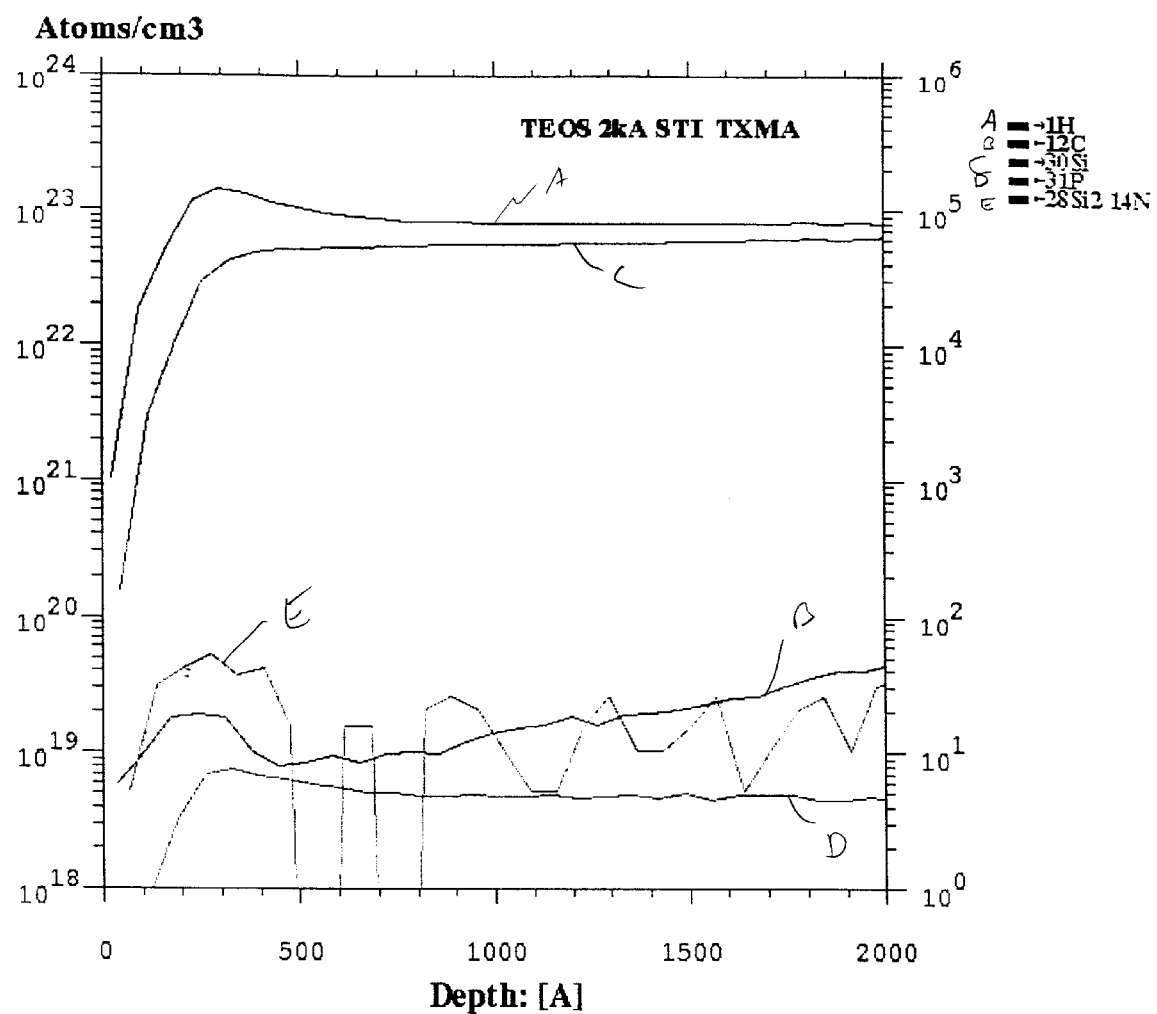

Finally, Table 3 illustrates test results for a test runs using TEOS source material for USG deposition. Corresponding FIG. 5 is a SIMS curve for the test run labeled 790 in Table 3.

TABLE 3

| Run # | Run 790 |
| --- | --- |
| Average Deposition Temperature (C) | 650.7 |
| Deposition Pressure (mTorr) | 1000 |
| TEOS Flow (sccm) | 120 |
| Average Deposition Rate (A/min) | 30.2 |

Different degrees of deposition rate change or reaction temperature reduction may occur depending on the types and amounts of the phosphorus dopants introduced.

The SIMs data (FIGS. 3 and 4) indicate that the C and N compositions are about 0.3% atomic. That is, unexpectedly, we deposit a phosphosilicate glass with trace N and C contents lower than that of the undoped BTBAS oxide and only about 10× the background levels measured in the TEOS oxide sample levels found in TEOS oxide.

The etch rate, SIMs, and gap fill data speak to the usefulness of the films even though they are deposited at low temperature. See Table 4.

Table 4 provides evidence of the usefulness of the BTBAS oxides by comparison of etch rates and etch rate ratios (ERR) with those of other known oxides. For many applications of oxide films in semiconductor devices, including the gap fill application, an oxide film that etches at a lower rate is desirable and indicates a denser film. Incorporation of phosphorous is known to increase the etching rate.

The BTBAS undoped oxide etches at a rate lower than that of TEOS undoped oxide in spite of its 75C lower

TABLE 1

| Run # | IBM1 | IBM2 | IBM3 | IBM4 | IBM6 | IBM6 | IBM7 | Run691 |
| --- | --- | --- | --- | --- | --- | --- | --- | --- |
| Average Deposition Temperature (C) | 575.0 | 575.0 | 575.0 | 575.0 | 575.0 | 575.0 | 575.0 | 539.2 |
| Deposition Pressure (mTorr) | 300 | 150 | 600 | 300 | 300 | 300 | 300 | 1000 |
| BTBAS Flow (sccm) | 75 | 75 | 75 | 38 | 150 | 75 | 75 | 150 |
| O2 Flow (sccm) | 150 | 150 | 150 | 75 | 300 | 75 | 300 | 300 |
| Average Deposition Rate (A/min) | 39.5 | 18.2 | 57.6 | 19.8 | 55.3 | 43.0 | 34.8 | 34.5 |

Figure 3:
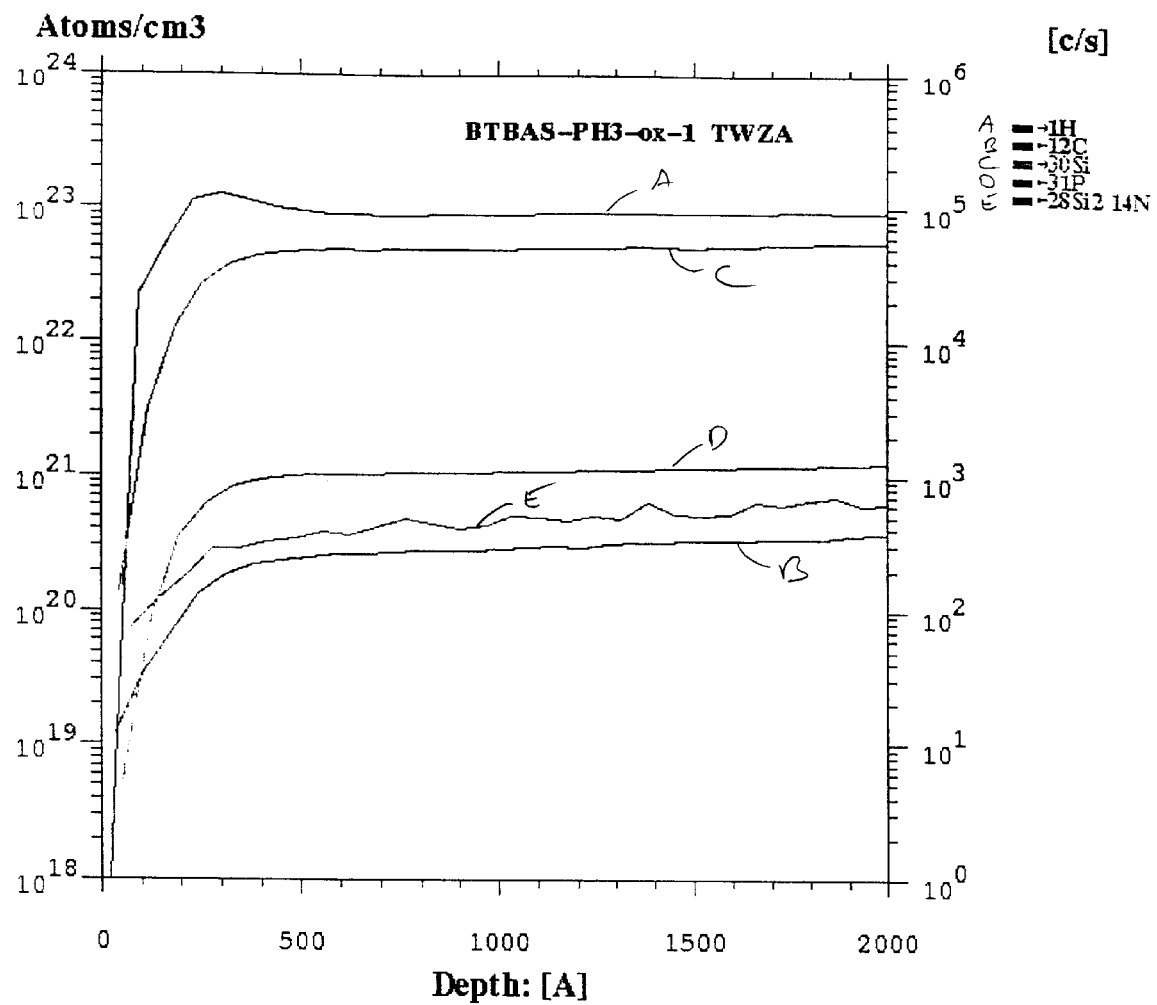
Figure 4:
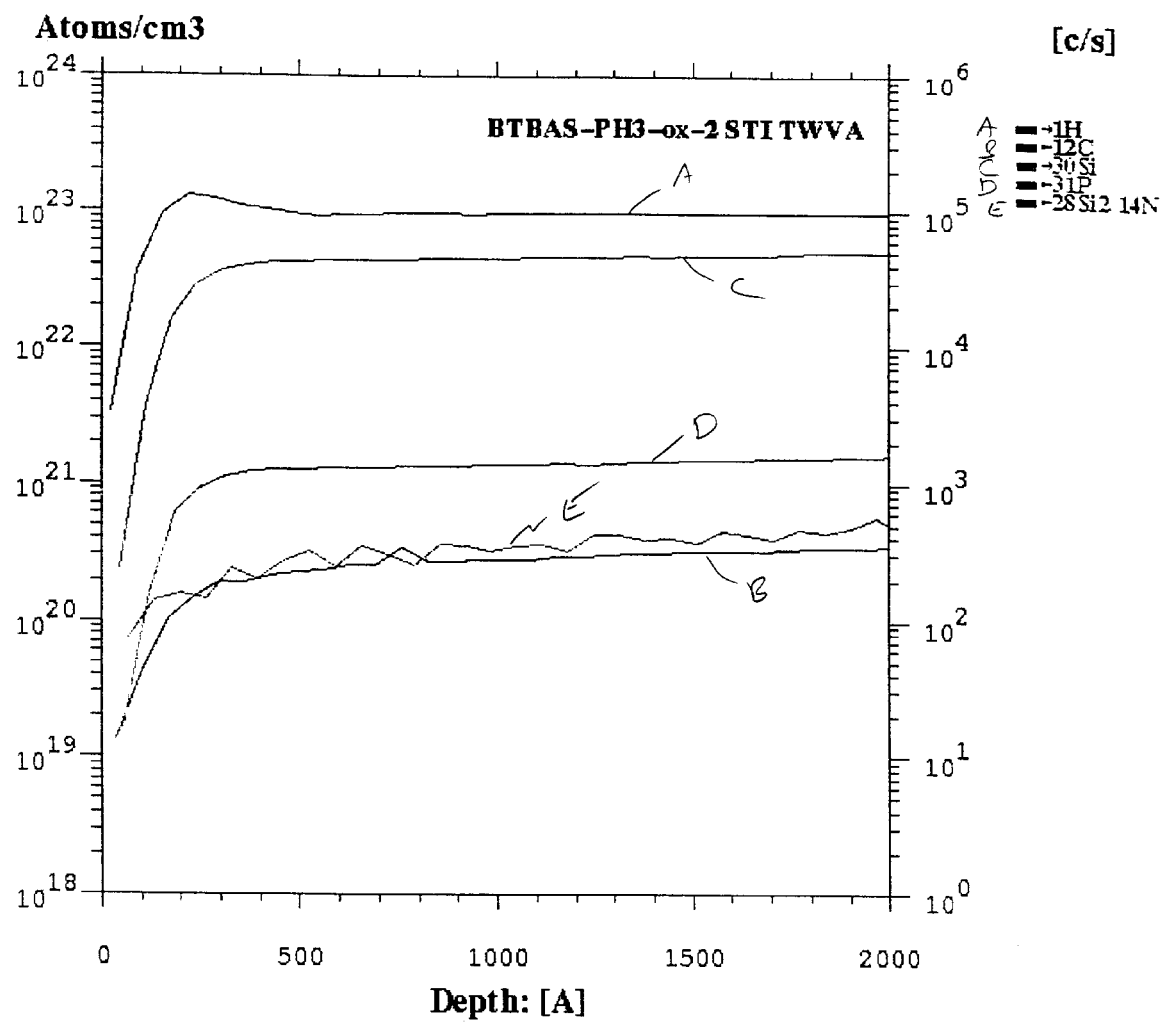

Table 2 illustrates test results for plural test runs using BTBAS source material for PSG deposition. Corresponding FIGS. 3 and 4 are SIMS curves for the respective test runs labeled 714 and 715 in Table 2.

TABLE 2

| Run # | Run 714 | Run 715 |
| --- | --- | --- |
| Average Deposition Temperature (C) | 453.8 | 509.0 |
| Deposition Pressure (mTorr) | 1000 | 333 |
| BTBAS Flow (sccm) | 150 | 150 |
| O2 Flow (sccm) | 300 | 300 |
| 10% PH3 Flow (sccm) | 150 | 150 |
| Average Deposition Rate (A/min) | 41.2 | 31.3 | deposition temperature. As HDP (highly density plasma) CVD oxide films are known to etch at rates close to those of thermal oxides, the etch rates of HDP CVD films are also shown for comparison. The etch rate of the phosphorous doped HDP PSG more than doubles at a level of 5.4% P.

The etch rate of the BTBAS PSG (run 697) is only about 39% higher than that of the HDP (high density plasma) CVD PSG for a comparable phosphorous level. Furthermore, as the ratio of ERR of BTBAS PSG to HDP PSG (1.4–1.6) is less than that of the ratio of ERR of TEOS oxide to HDP USG (2.1), we expect that the BTBAS PSG to provide an equivalent or greater improvement in density over TEOS PSG than does BTBAS USG vs. TEOS USG. This analysis speaks to the improved properties of the BTBAS PSG in spite of its deposition at a temperature of 500C (150C less than TEOS oxide).

TABLE 4

| | | | | Deposition Conditions | | | | | | |
|---|---|---|---|---|---|---|---|---|---|---|
| Property of the film | | | Etch Rate relative to | | | | | | | |
| Dep Run # | P weight % | Etch Rate (A/min) | thermal oxide ERR | Temp. (° C.) | Pressure (mTorr) | BTBAS (sccm) | O2 (sccm) | 10% PH3 (sccm) | TEOS (sccm) | N2 (sccm) |
| IBM 1 BTBAS USG | | 6.17 | 2.32 | 575 | 300 | 75 | 150 | | | |
| IBM 5 BTBAS USG | | 6.18 | 2.32 | 575 | 300 | 150 | 300 | | | |
| IBM 7 BTBAS USG | | 6.00 | 2.25 | 575 | 300 | 75 | 300 | | | |
| Run 696 PH3_Ox_1 | 4.3 | 7.84 | 2.94 | 500 | 333 | 150 | 300 | 150 | | |
| Run 697 PH3_Ox_2 | 5.5 | 8.85 | 3.32 | 500 | 375 | 150 | 300 | 300 | | |
| Run 699 PH3_Ox_1 | 4.90 | 10.36 | 3.89 | 475 | 1000 | 150 | 300 | 150 | | |
| Run 701 PH3_Ox_3 | 6.37 | 10.01 | 3.76 | 475 | 1000 | 150 | 300 | 150 | | |
| LPCVD TEOS 65° C. 1 | | 6.80 | 2.55 | 650 | 1000 | | | | 95 | 100 |
| LPCVD TEOS 65° C. 2 | | 6.50 | 2.44 | 650 | 1000 | | | | 95 | 100 |
| HDP PSG 55° C.–60° C. | 5.41 | 6.33 | 2.38 | | | | | | | |
| HDP USG 55° C.–60° C. | | 3.05 | 1.14 | | | | | | | |
| Thermal Oxide 1 | | 2.66 | 1.00 | | | | | | | |

Thus, in accordance with the invention, PSG and BPSG deposition with BTBAS lower the reaction temperature at comparable deposition rates or enhances deposition rate at comparable temperatures compared to prior methods of making PSG, BSG or BPSG. An estimated BTBAS PSG process temperature range is 400 C to 650 C. It has been found experimentally that it is possible to deposit PSG below 500 C as a reasonable deposition rate. This was performed in an appropriate furnace. At 475 C a deposition rate of 51.8A/min with measured phosphorus concentration of 4 atomic percent was achieved. Assuming 5A/min as the lower cutoff usable deposition rate, and halving of the deposition rate, it was concluded that a PSG process as low as 400 C would be feasible. Such low deposition temperature enables a different type of application in the semiconductor industry, especially in the BEOL (back end of the line) area or MOL (middle of the line) area where the temperature limitations are major constraints. For example, the conventional undoped TEOS deposition uses a deposition temperature range of 620 C to 720 C. The reaction temperature for the PSG or BPSG according to the process disclosed herein puts the reaction temperature advantageously around 420 C to 550 C, which is compatible with many BEOL and MOL processes respectively.

Thus, the process disclosed herein provides reduction of deposition temperature by as much as 100 C in BTBAS PSG compared with BTBAS USG (undoped silicate glass or undoped oxide) because phosphorus is added deliberately to the process to enhance deposition rate. Likewise, the method relates to BPSG since phosphorus is likely to enhance the deposition rate of BPSG due to the presence of phosphorus.

In accordance with another aspect of the invention, BTBAS is used to deposit doped and undoped oxides at low temperatures for gap fill applications including DT (deep trench) fill, STI (shallow trench isolation) fill, etc. In any gap fill application it is important to produce a conformal coating. In accordance with the invention, deposition using BTBAS provides better gap fill and at lower reaction temperatures.

Figure 6:
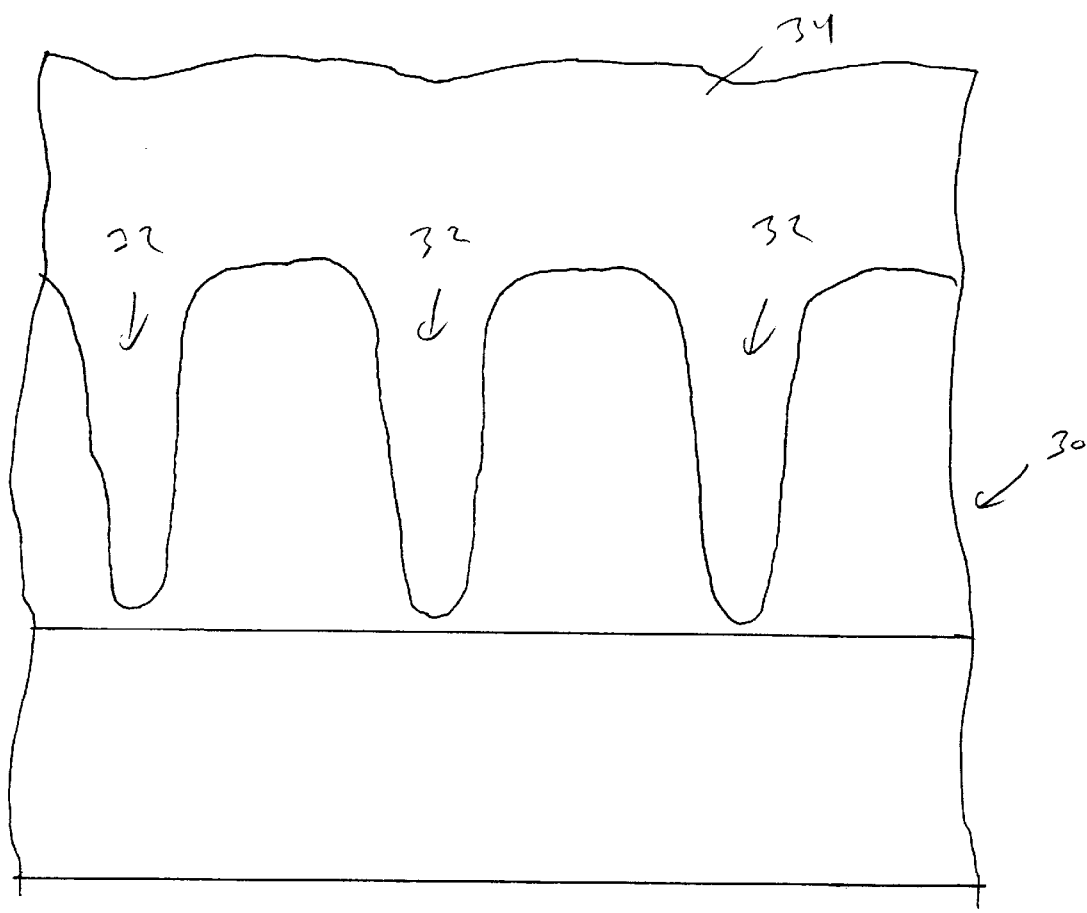
FIG. 6 is a sectional view of a semiconductor device having an oxide film for gap. fill in accordance with. the invention.

In tests, it has been found that using BTBAS in gap fill applications, compared to TEOS, at substantially reduced reaction temperatures, provides substantially void-free gap fill. Referring to FIG. 6, a cross-sectional view illustrates outlining from an SEM photograph of a semiconductor device manufactured using BTBAS in a gap fill application. A substrate 30 defines plural gaps 32 to be filled. Flowing BTBAS and oxygen into the LPCVD reactor 10 of FIG. 1 reacts on the substrate 30 to deposit a relatively conformal oxide film 34, as illustrated. Similar results were obtained using BTBAS and phosphorous dopant in gap fill applications.

With USG deposition for gap fill applications using BTBAS the process temperature range is 500 C to 650 C. With PSG deposition for gap fill applications using BTBAS the process temperature range is 400 C to 550 C. These are lower than the conventional TEOS oxide deposition temperature of 575 C to 750 C. The reduced process temperature enables the application of the BTBAS oxide, both doped and undoped, to gap fill process as part of integration schemes. This can be used to provide As, B, P and/or Ge doped glass. This method provides low temperature void-free fill without the need for a subsequent furnace anneal for low aspect ratio (less than 3) gaps. At higher aspect ratio, a steam anneal at 650–750C may be added to densify and/or reflow the BTBAS doped oxide.

Thus, in accordance with the invention, BTBAS is used to provide low temperature doped oxides for semi-conductor production, and is used for gap fill oxide films.

Those skilled in the art will appreciate that other oxidation sources such as $N_2O$, NO, and $NO_2$ may be added in addition to or as an alternative to $O_2$. Also, BTBAS may be substituted with fluorinated versions thereof where F is bonded to Si or N.

While the invention has been described in terms of specific embodiments, it is evident in view of the foregoing description that numerous alternative, modifications and variations will be apparent to those skilled in the art. Accordingly, the invention is intended to encompass all such alternatives, modifications and variations which fall within the scope and spirit of the invention and the following claims.

We claim:

1. The process of low pressure chemical vapor deposition (LPCVD) of doped oxide film on a substrate comprising the steps of:

providing a substrate in an LPCVD reactor;

flowing BTBAS and oxygen into the LPCVD reactor to react on the substrate to deposit an oxide film on the substrate; and flowing a dopant precursor into the LPCVD reactor to dope the oxide film as it is deposited on the substrate, wherein the oxide film includes carbon and nitrogen in concentrations each less than 1.3% atomic.

2. The process of claim 1 wherein the doped oxide film comprises a PSG film.

3. The process of claim 1 wherein the doped oxide film comprises a BPSG film.

4. The process of claim 1 wherein a temperature of the LPCVD reactor is in a range of 400 C to 650C.

5. The process of claim 1 wherein wherein a temperature of the LPCVD reactor is below 500C.

6. The process of claim 1 wherein the dopant precursor is selected from a group consisting of $PH_3$, TEPO, TMPi, $B_2H_6$, TEB and TMB.

7. The process of low pressure chemical vapor deposition (LPCVD) of doped oxide film on a substrate comprising the steps of;

providing a substrate in an LPCVD reactor;

flowing BTBAS and oxygen into the LPCVD reactor to react on the substrate to deposit an oxide film on the substrate at a select reaction rate; and flowing a phosphorus precursor into the LPCVD reactor to dope the oxide film as it is deposited on the substrate at a relatively low reaction temperature, wherein the oxide film includes carbon and nitrogen in concentrations each less than 0.5% atomic.

8. The process of claim 7 wherein the select reaction temperature of the LPCVD reactor is below 500C.

9. The process of claim 7 wherein the select reaction temperature is in the range of 500C–650 C for relatively higher deposition rates.

10. The process of claim 7 wherein the phosphorous precursor is selected from a group consisting of $PH_3$, TEPO and TMPi.

11. The process of low pressure chemical-vapor deposition (LPCVD) of oxide film for gap fill on a semiconductor substrate defining plural gaps to be filled by the oxide film, comprising the steps of:

providing the semiconductor substrate in an LPCVD reactor; and flowing BTBAS and oxygen into the LPCVD reactor to react on the substrate to deposit a relatively conformal oxide film on the substrate, wherein the oxide film includes carbon and nitrogen in concentrations each less than 1.3% atomic.

12. The process of claim 11 wherein a temperature of the LPCVD reactor is in a range of 500C to 650C.

13. The process of claim 11 further comprising the step of flowing a dopant precursor into the LPCVD reactor to dope the oxide film as it is deposited on the semiconductor substrate to produce a doped glass film.

14. The process of claim 13 wherein the doped glass film is selected from a group consisting of As, B, P and/or Ge doped glass films.

15. The process of claim 13 wherein the doped glass film is a PSG doped glass film.

16. The process of claim 13 wherein the doped glass film is a BPSG doped glass film.

17. The process of claim 2 wherein the oxide film includes carbon and nitrogen in concentrations each less than 0.5% atomic.

18. The process of claim 15 wherein the glass film includes carbon and nitrogen in concentrations each less than 0.5% atomic.

* * * * *